United States Patent [19]

Muraoka

[11] 3,942,126
[45] Mar. 2, 1976

[54] BAND-PASS FILTER FOR FREQUENCY MODULATED SIGNAL TRANSMISSION

[75] Inventor: Teruo Muraoka, Sagamihara, Japan

[73] Assignee: Victor Company of Japan, Limited, Yokohama, Japan

[22] Filed: Nov. 18, 1974

[21] Appl. No.: 524,818

[30] Foreign Application Priority Data
Nov. 18, 1973 Japan.............................. 48-129475
Mar. 14, 1974 Japan.............................. 49-28545

[52] U.S. Cl............... 328/167; 179/15 A; 333/70 T
[51] Int. Cl.$^2$.......................................... H04B 1/04
[58] Field of Search..................... 328/167; 307/295; 333/70 T; 179/15 A

[56] References Cited
UNITED STATES PATENTS

| | | | |
|---|---|---|---|
| 3,532,908 | 10/1970 | Jennings | 307/295 |
| 3,805,173 | 4/1974 | Nakamura et al. | 328/167 X |
| 3,887,874 | 6/1975 | Reed et al. | 328/167 |

*Primary Examiner*—John S. Heyman

[57] ABSTRACT

A band-pass filter comprises a delay circuit comprising a plurality of unit delay elements connected in cascade arrangement and receiving as input a signal including a frequency modulated signal and a coefficient summing circuit for carrying out coefficient summing of the outputs of specific delay units of the delay circuit and producing as output the frequency moudlated signal which has been band-pass filtered. This band-pass filter has a transmission characteristic representable by $$H(j\omega) = [1 - a(\omega - \omega_o)^2]e^{-j\omega\tau_d},$$

where:
- $a$ is a constant imparting an attenuation characteristic of the filter;
- $\omega_o$ is an angular frequency of a carrier wave of a frequency modulated signal and a center angular frequency of the band-pass filter; and
- $\tau_d$ is a delay time of the band-pass filter.

9 Claims, 24 Drawing Figures

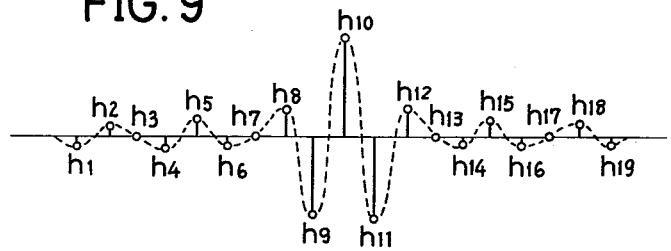
FIG. 9
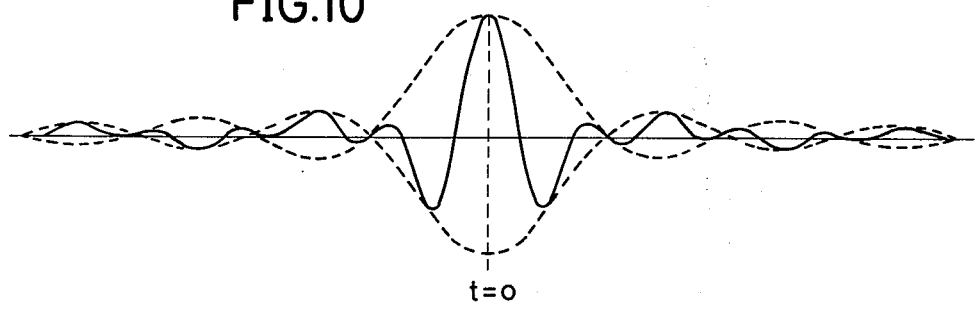
FIG.10
t=0
FIG.11
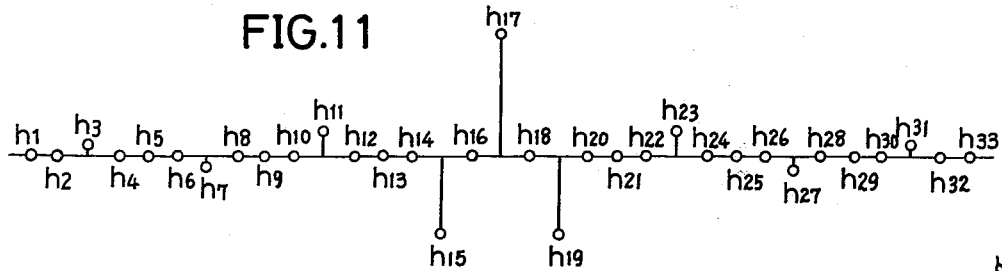
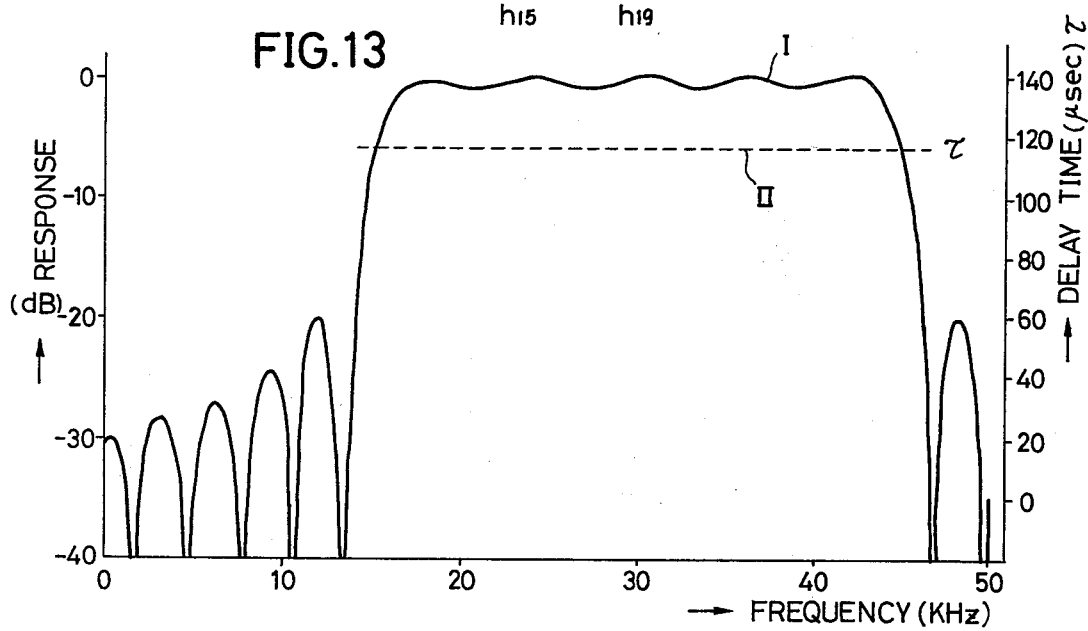
FIG.13

BAND-PASS FILTER FOR FREQUENCY MODULATED SIGNAL TRANSMISSION

BACKGROUND OF THE INVENTION

The present invention relates to a band-pass filter and more particularly to a band-pass filter for band-pass filtering frequency modulated signals with good frequency response characteristic and good dely time characteristic.

In general, in a frequency modulated signal transmitted in a transmission system, when a variation occurs in a side band as a result of effects such as that of the amplitude characteristic and the group delay characteristic, distortion occurs in the demodulated output when the signal is demodulated. A distortion arising from such a cause becomes a very great problem in the case where the transmission system is a narrow band circuit having selectivity as in a band-pass filter and the like.

In a band-pass filter known heretofore, however, the amplitude characteristic cannot become symmetrical with respect to the center frequency of the pass band, and, moreover, the group delay characteristic does not become flat and has a great deviation. Consequently, in a frequency modulated signal which has passed through a band-pass filter of this known character, a large distortion is generated.

Accordingly, with the aim of minimizing the occurrence of distortion, various kinds of forms of band-pass filters have heretofore been proposed. Each of these filters, however, has required a large number of passive circuit elements and much time for adjustment and has been accompanied by other problems such as inability to attain sufficient reduction of distortion. Accordingly, with the aim of leveling the delay characteristic of the filter as much as possible, the selectivity of the filter has been lowered in some cases.

However, it is necessary to increase the selectivity in a band-pass filter wherein it is necessary to extract one signal of a band close to that of another signal as, for example, a band-pass filter used in a discrete 4-channel record disc reproducing system to extract an angle-modulated wave signal from a multiplexed signal of a direct wave signal and an angle-modulated wave signal reproduced from a record disc. Furthermore, if the delay time characteristic is not flat, the stererophonic sensation imparted by the reproduced sound formed by the loudspeakers will be unsatisfactory.

SUMMARY OF THE INVENTION

Accordingly, it is an object of the present invention to provide a band-pass filter for frequency modulated signal transmission in which the above described difficulties have been overcome, and the above described requirements have been fulfilled.

A specific object of the invention is to provide a band-pass filter having high selectivity and, moreover, having a transmission characteristic which is symmetrical above and below with respect to a center frequency of the filtering band.

Another object of the invention is to provide a band-pass filter having a group delay time characteristic which is fully flat within the transmission band of the signal being transmitted.

A further object of the invention is to provide a band-pass filter capable of extracting, together with a band-pass filtered signal, and unfiltered signal having any delay time. This band-pass filter is effective particularly when used in a discrete multichannel record disc reproducing system.

Other objects and further features of the invention will be apparent from the following detailed description with respect to preferred embodiments of the invention when read in conjunction with the accompanying drawings.

BRIEF DESCRIPTION OF THE DRAWINGS

In the drawings:

FIGS. 9, 10, and 11 are graphs respectively indicating impulse response characteristics;

FIG. 13 is a graph indicating the frequency-response characteristic and the frequency-delay time characteristic of the band-pass filter in the circuit shown in FIG. 12;

FIG. 23 is a circuit diagram of an actual embodiment of the band-pass filter of the invention.

DETAILED DESCRIPTION

The band-pass filter according to the present invention will now be described with respect to an embodiment thereof wherein it is applied to a multichannel record disc.

Figure 1:
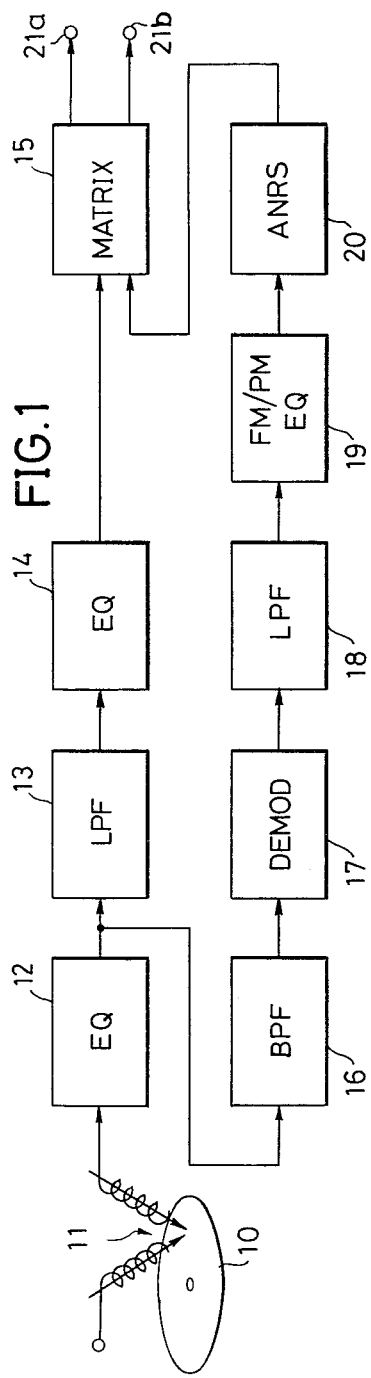
FIG. 1 is a block diagram showing the essential organization of one example of a discrete 4-channel record disc reproducing system of general type.

A discrete 4-channel record disc reproducing system which has been granted U.S. Pat. No. 3,686,471 and is already generally in practical use will first be described with reference to FIG. 1 showing by block diagram the general essential organization of the system. A multiplexed signal of a direct wave sum signal and an angle-modulated difference signal of each pair of two channels is recorded on each side wall of the sound groove of a four-channel record disc 10, thereby recording the signals for a total of four channels. A multiplexed signal of the direct wave sum signal and the angle-modulated wave difference signal for the two-channel signal picked up from the left wall of the grooves of the disc 10 by a pickup cartridge 11 is fed to an equalizer 12 with a turnover RIAA characteristic for equalization.

The resulting signal is fed to a low-pass filter 13 for elimination of the angle-modulated wave component and for deriving the direct wave sum signal component only. The direct wave sum signal is fed to a matrix circuit 15 via an equalizer 14 provided with a roll-off RIAA characteristic.

The output of the equalizer 12 is partly fed to a band-pass filter 16 with a passband in the approximate range of from 20 KHz to 45 KHz and an angle-modulated wave difference signal is derived from this filter. The angle-modulated wave difference signal is fed to a demodulator 17. The demodulated output from the demodulator 17 is supplied to a low-pass filter 18 and the unwanted components contained in the output are eliminated thereat. The output from the low-pass filter 18 is fed to the matrix circuit 15 via in succession an FM/PM equalizer 19 and an automatic noise reduction system (ANRS) circuit 20 comprising an expandor which presents a characteristic to compensate for the characteristic of a compressor in the recording system.

In the matrix circuit 15, the direct wave sum signal from the equalizer 14 and the demodulated difference signal from the ANRS circuit 26 are matrixed and from output terminals 21a and 21b are derived, for instance, the left front (the first channel) and the left rear (the second channel) signals, respectively.

While there is shown in FIG. 1 only the circuit system for the first and second channel signals (the left channel system for the grooves of the disc 10), exactly the same circuit system is provided for the right front (the third) and the right rear (the fourth) channel. Detailed illustration and description of this same system are omitted herein.

Here, the existence of the pickup cartridge 11, the band-pass filter 16, the demodulator 17, and other parts gives rise to a time difference between the sum signal and the difference signal supplied to the matrix 15. More specifically, the delay time $\tau t$ of the difference signal relative to the sum signal is equal to the sum of a delay time $\tau a$ due to the pickup cartridge 11, a delay time $\tau b$ due to the band-pass filter 16, and a delay time $\tau c$ due to the demodulator 17. That is, $\tau t = \tau a + \tau b + \tau c$. When there is a time difference between the two signals in this manner, the stereophonic sensation of the sounds being reproduced become unsatisfactory.

Accordingly, with the average value of the above mentioned delay time $\tau t$ taken at 40 $\mu$sec., the sum signal is recorded beforehand with a delay of 40 $\mu$sec. relative to the difference signal in the recording system of the record disc with the aim of preventing as a net result the occurrence of the time difference between the sum and difference signals in the reproducing system.

It is difficult, however, to set the delay time $\tau t$ accurately at 40 $\mu$sec. in the reproducing system. Since the pickup cartridge 11, particularly, has a mechanical resonance system constituting a principal part thereof, there are large irregularities in the delay time $\tau a$, which thereby deviates greatly from 40 $\mu$sec. Thus, there arises a first problem in that reproduction with high fidelity cannot be accomplished.

On the other hand, the signal reproduced by the pickup cartridge 11 from the record disc 10 is multiplexed signal of a direct wave sum signal of a band of from 10 Hz to 15 KHz and an angle-modulated wave difference signal of a band of from 20 KHz to 45 KHz. Since the bands of the direct wave sum signal and the angle-modulated wave signal are thus close to each other, it is not possible to obtain a filtration band having ample margin in the band-pass filter 16, and a relatively steep cut-off characteristic is required.

Figure 2:
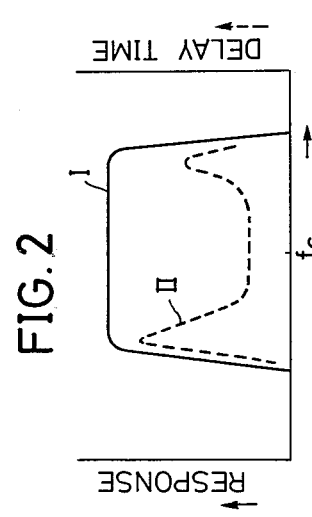
FIG. 2 is a graph indicating the frequency-response characteristic and the frequency-delay time characteristic of a known band-pass filter.

Accordingly, in the known band-pass filter 16, the delay time characteristic obtained by differentiating the phase characteristic with respect to the frequency becomes as indicated by the broken line curve II in FIG. 2 relative to the filtration band indicated by the full line curve I. Thus, as indicated in FIG. 2, the delay time characteristic becomes substantially flat at the central part of the filtration band, but in the vicinity of the upper and lower limits thereof, it fluctuates greatly. In the known band-pass filter 16, therefore, there exists a second problem in that a uniform delay time characteristic cannot be obtained, and distortion develops in the demodulation output of the demodulator 17.

This has given rise to another problem in that attempts to provide a band-pass filter of uniform delay time characteristic have resulted in filters of complicated circuit organization which have been accompanied by great difficulties in practical realization.

Figure 3:
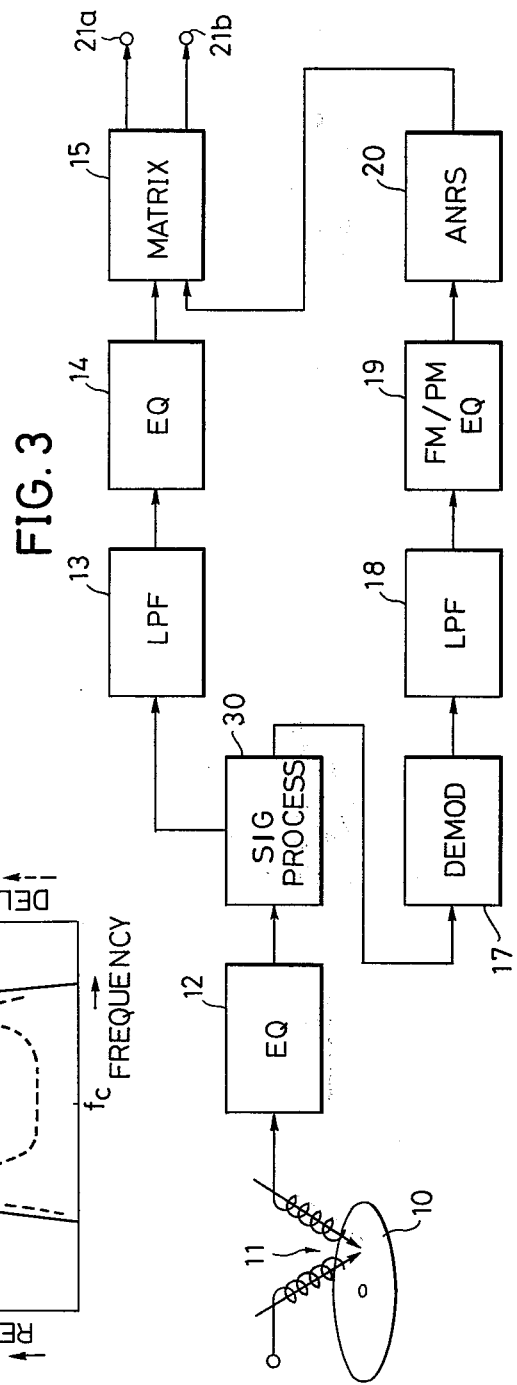
FIG. 3 is a block diagram showing the essential organization of one embodiment of a discrete 4-channel record disc reproducing system in which a band-pass filter of the invention is applied.

Accordingly, the present invention provides a novel band-pass filter in which the above described problems have been solved. The band-pass filter of the present invention will now be described with reference to FIG. 3 with respect to an embodiment thereof used in a multichannel record disc reproducing system. In FIG. 3, parts which are the same as corresponding parts in FIG. 1 are designated by like reference numerals, and such parts will not be described again in detail.

In the system illustrated in FIG. 3, a multiplexed signal which has been reproduced from the 4-channel record disc 10 by the pickup cartridge 11 and has passed through the equalizer 12 is supplied to a signal processing circuit 30 comprising a band-pass filter according to the present invention. The anglemodulated difference signal component filtered by this signal processing circuit 30 is then fed to the demodulator 17. On the other hand, a reproduced multiplexed signal which has been derived from a delay element, to be described hereinafter, in the signal processing circuit 30 and caused to have a desired delay time is supplied to the low-pass filter 13.

Figure 4:
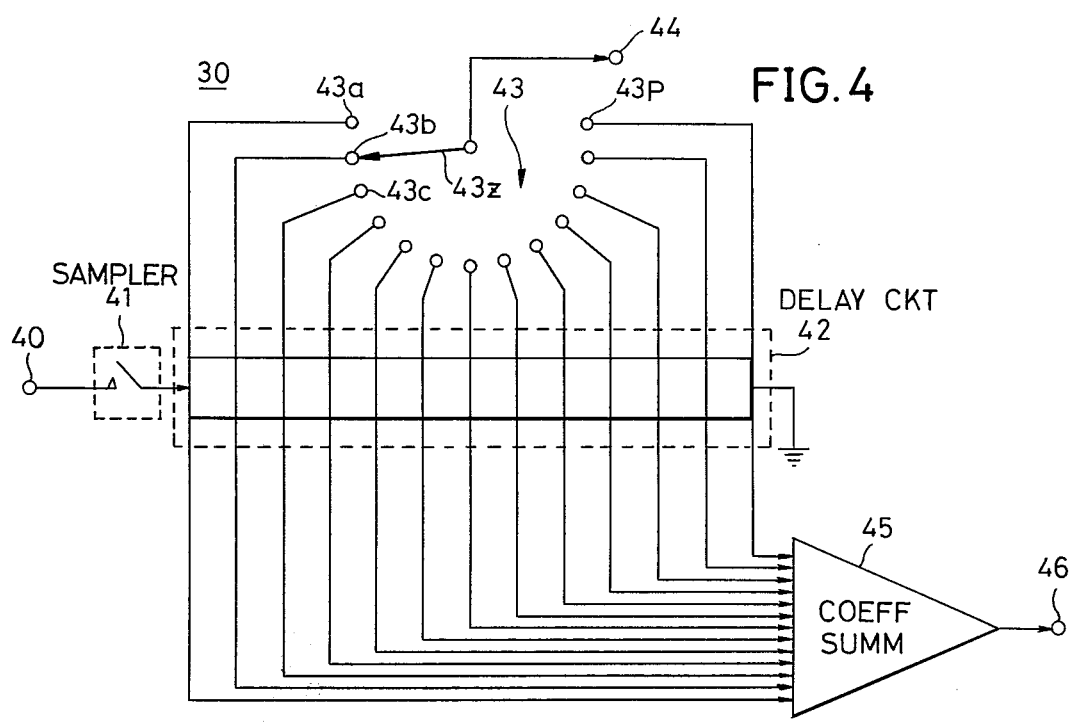
FIG. 4 is a circuit diagram showing a first embodiment of signal processing circuit including the band-pass filter of the invention.

A specific circuit system of a first embodiment of the signal processing circuit 30 is shown in FIG. 4. The above mentioned reproduced multiplexed signal from the equalizer 12 is applied through an input terminal 40 of this circuit 30 and is subjected to sampling at a frequency which is at least twice the maximum frequency of the reproduced signal by a sampler 41. The signal thus sampled is supplied to a multistage delay circuit 42. This multistage delay circuit 42 comprises a cascade connection circuit of a plurality of unit delay elements, whose delay times are the same as the sampling periods of the sampler 41.

The output signals of the unit delay elements of this multistage delay circuit 42 are respectively supplied, on the one hand, to fixed contact points 43a through 43p of a changeover switch 43 having a movable contact 43z which is for contacting any one of the fixed contact points 43a through 43p and is connected to an output terminal 44. Accordingly, reproduced signals having different specific delay times can be selected by switching the movable contact 43z to respective fixed contact points 43a through 43p and supplied by way of the output terminal 44 to the low-pass filter 13 of the succeeding stage.

Therefore, by switching the movable contact 43z of the changeover switch 43 thereby to obtain as output a reproduced signal of a desired delay time from the multistage delay circuit 42. For example, in the case wherein the multistage delay circuit 43 comprises 2N unit delay elements, and the delay time of the unit elements is denoted by $\tau s$, signals of different delay times can be derived in steps of $\tau s$ between time delay magnitudes from zero to $\tau s \times 2N$ by changing over the movable contact 43z of the changeover switch 43. Thus, the above mentioned first problem is solved.

With regard to this multistage delay circuit 42, it is to be noted that, as described hereinbelow, it is used as one of the essential circuit components constituting the band-pass filter and is not provided merely for the purpose of deriving a signal of a desired delay time as described above. Therefore, there is no necessity whatsoever of using a variable delay circuit especially and exclusively for correcting the above described time difference, whereby a circuit of inexpensive organization suffices.

Next, the band-pass filter constituting an essential part of the present invention will now be described. The output signals of the multistage delay circuit 42, on the other hand, are respectively supplied to a coefficient summing circuit 45. The above mentioned sampler 41, multistage delay circuit 42, and coefficient summing circuit 45 constitute a band-pass filter comprising a sampling filter of non-cyclic type exhibiting a constant delay time characteristic within a prescribed transmission band as described hereinbelow.

The principle of organization of this non-cyclic type sampling filter is as follows. In an analog circuit, in general, there is a relationship of convolution as follows between the input $X(t)$, output $y(t)$, and the impulse response $h(t)$ expressed as function of time.

$$y(t) = \int_0^\infty h(t)X(t-\tau)d\tau \qquad (1)$$

In correspondence with this Eq.(1), the relationship of the input $X(t)$, output $y(t)$, and impulse response $h(t)$ is expressed by the following equation for the reason that the input is applied dispersively as X1, X2, X3, ......... in time sequence with a time interval for every sampling period $\tau s$.

$$yj = \sum_{n=0}^{2N} hnXj-n \qquad (2)$$

This Eq.(2) indicates that, by suitably selecting the impulse response coefficients $h0, h1, h2, \ldots h2N$ in this equation, a filter characteristic as desired having the value of impulse response thereof can be obtained.

Figure 5:
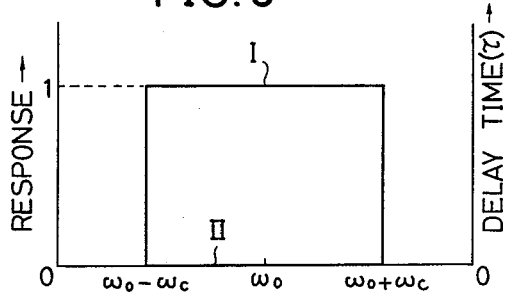
FIG. 5 is a graph indicating the frequency-response characteristic and the frequency-delay time characteristic both of ideal form (impossible of realizing) of a band-pass filter.

A characteristic curve of a band-pass filter having an ideal characteristic is shown in FIG. 5. That is, the frequency response characteristic I is an ideal characteristic wherein the amplitude in a pass band indicated by a range of $\pm \omega c$ with an angular frequency $\omega o$ as the center is 1 (unity), and the amplitude becomes zero at other parts. Furthermore, as for the delay time characteristic, it is zero as indicated at II.

The impulse response $hj(t)$ of a band-pass filter exhibiting an ideal characteristic as in FIG. 5 is expressed by the following equation.

$$hj(t) = \frac{2}{\pi} \frac{\sin \omega c t}{t} \cos \omega o t \qquad (3)$$

Figure 6:
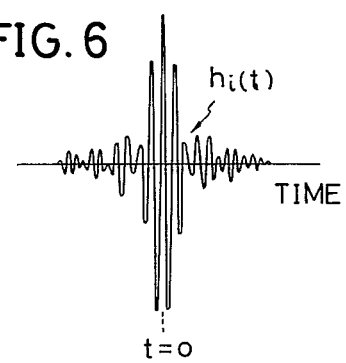
FIG. 6 is a graph indicating the impulse response characteristic of the band-pass filter having the characteristics indicated in FIG. 5.

This impulse response $hj(t)$ becomes as indicated in FIG. 6. As is apparent from FIG. 6, the impulse response of a band-pass filter having the ideal characteristic of FIG. 5 has a symmetrical shape with respect to the time instant $t = 0$, that is, the response must exist also in negative time. Accordingly, it is impossible in practice to realize a filter of an inpulse response $hj(t)$ of this character.

On one hand, the impulse response $hj(t)$ exhibits the property of a Fourier transformation.

$$H(j\omega) = \int_{-\infty}^{\infty} hi(t) e^{-j\omega t} dt \qquad (4)$$

As is apparent from this Eq.(4), $t$ exists over the range from $-\infty$ to $+\infty$. For this reason, also, the realization of a band-pass filter exhibiting an impulse response $hj(t)$ is impossible.

In this connection, in the case where the impulse response $h(t)$ exhibits a symmetrical shape with respect to the time instant $t = 0$, that is, $h(t)$ is an even function, the transmission function $H(j\omega)$ of a filter having this impulse response $h(t)$ is expressed as follows.

$$H(j\omega) = \int_{-\infty}^{\infty} h(t) \cos \omega t \, dt \qquad (5)$$

As long as the impulse response $h(t)$ is an even function in this manner (the transmission function $H(j\omega)$ becoming a real function), it can be said that the corresponding delay time of the filter is zero. Accordingly, even if an impulse response wherein $t$ ranges from $-\infty$ to $+\infty$ is terminated at a suitable time instant with the condition of symmetry with respect to $t = 0$ still satisfied, the condition that the delay time within the transmission band is zero will still be satisfied. In this respect, if an original impulse response which is distributed over a range of from $t = -\infty$ to $t = +\infty$ is terminated after a finite range ending at a suitable time instant as mentioned above, the resulting effect will appear as a variation in the cut-off characteristic in the transmission characteristic.

However, even if the impulse response is limited within a certain finite range in the above described manner, it will still be necessary that there be a response also in the part of the impulse response prior to $t = 0$, that is, also in negative time. Therefore, under these circumstances, a filter still cannot be made.

Figure 7A:
FIGS. 7A and 7B are graphs respectively indicating a first impulse response characteristic resulting from a restriction of the impulse response characteristic indicated in FIG. 6 within a certain finite time range and a second impulse response characteristic which is displaced (lagged) relative thereto by a certain time on the time axis.
Figure 7B:
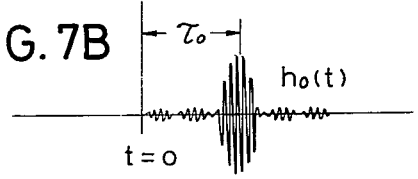

Accordingly, by shifting the impulse response $h(t)$ indicated in FIG. 7A, which has been terminated within a finite time range, in entirety along the time axis by $\tau o$ to a state as indicated in FIG. 7B, it is possible to realize in practice a filter having this impulse response indicated in FIG. 7B. Since this impulse response $ho(t)$ indicated in FIG. 7B results from the shifting of the impulse response indicated in FIG. 7A along the time axis by $\tau o$, it can be represented as follows, from Eq.(3).

$$ho(t) = \frac{2}{\pi} \frac{\sin \omega c(t - \tau o)}{(t - \tau o)} \cos \omega o(t - \tau o) \qquad (6)$$

Furthermore, the transmission function $Ho(j\omega)$ of a filter having the impulse response $ho(t)$ of Eq.(6) becomes $$Ho(j\omega) = H(j\omega) e^{-j\omega \tau o} \qquad (7)$$

Figure 8:
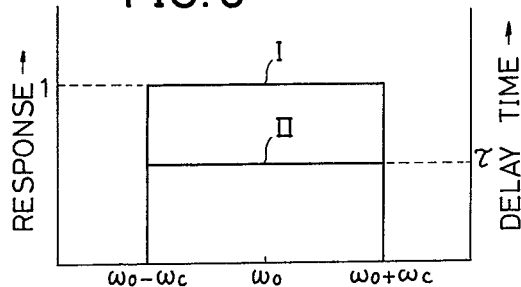
FIG. 8 is a graph indicating the frequency-response characteristic and frequency-delay time characteristic of a band-pass filter according to the invention.

Since the delay term $e^{-j\omega \tau o}$ is uniform and unrelated to the frequency, the delay of the signal within the transmission band is completely flat relative to the frequency. The transmission characteristic I and the delay time characteristic II expressed by the above Eq.(7) are shown in FIG. 8.

The coefficient hn of the coefficient summing circuit 45 shown in FIG. 4 is a value resulting from the sampling of the impulse response $ho(t)$ with the sampling period $\tau s$. By shifting the entire impulse response by $\tau o$ as described above, the value of the coefficient $h(n\tau)$ with respect to the output signal of the unit delay element positioned at exactly the middle of the multistage delay circuit 42 is caused to become $ho(\tau o)$. One example of the impulse response characteristic in the case where $n = 9$ is shown in FIG. 9. The envelope of the impulse response is shown by full line in FIG. 10.

In a discrete 4-channel record disc, if the maximum frequency of the angle-modulated wave difference signal of a carrier wave frequency of 30 KHz is taken at 45 KHz, it is necessary that the sampling frequency be higher than 90 KHz. On one hand, in the case where an impulse response wherein $t$ exists from $-\infty$ to $+\infty$ is limited to a finite time width as described above, the organization of the coefficient summing circuit 45 can be made simple by so selecting the above mentioned sampling frequency that as many as possible of the sample values of the impulse response existing within this finite time width will assume the value of zero.

As one example, if the above mentioned sampling frequency is selected at 120 KHz, those of the sample values of the impulse response which do not become zero will become only $h3$, $h11$, $h15$, $h17$, $h19$, $h23$, $h27$, and $h31$ as indicated in FIG. 11, and the organization of the coefficient summing circuit 45 will become simple.

Furthermore, in the case where the sampling frequency is selected at 120 KHz as mentioned above, the delay times of the unit delay elements in the multistage delay circuit 42 become $8\frac{1}{3}$ μsec., which is the same as the sampling period, and signals of delay time in steps of $8\frac{1}{3}$ μsec. are obtained from the changeover switch 43.

Figure 12:
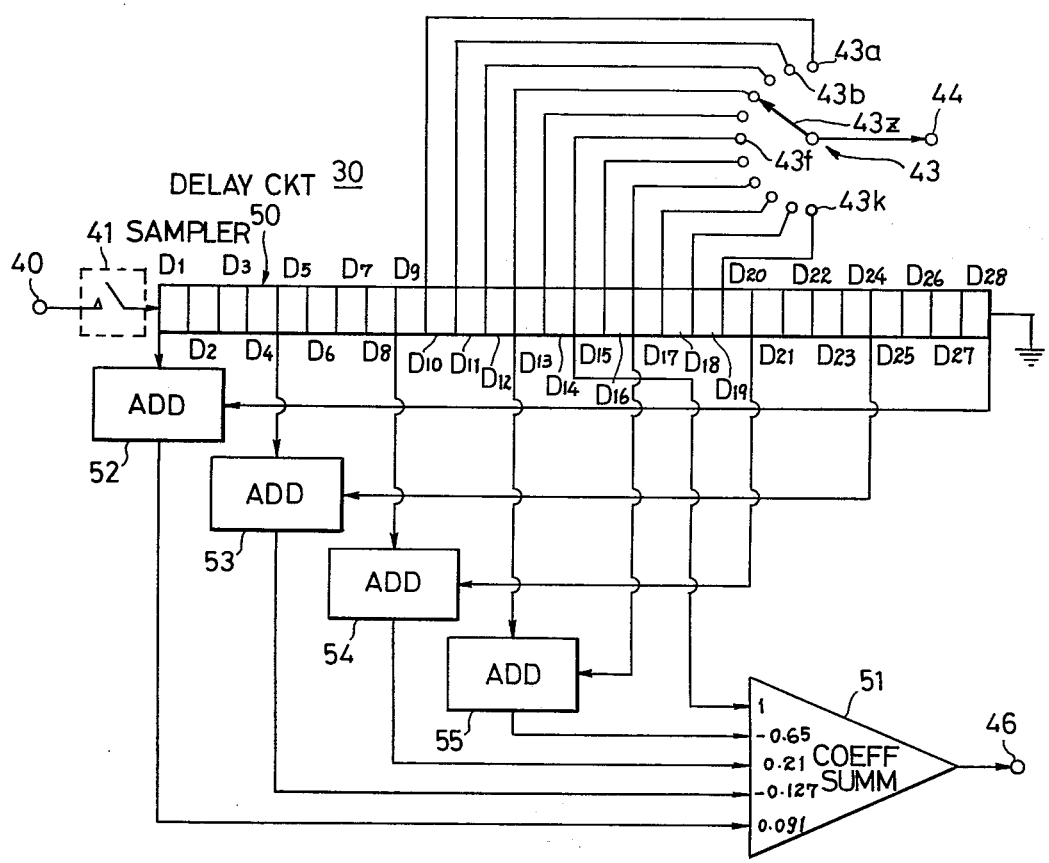
FIG. 12 is a circuit diagram showning a second embodiment of the signal processing circuit in the system illustrated in FIG. 3.

As a second embodiment of the signal processing circuit 30, a signal processing circuit comprising a noncyclic type sampling filter in which the sampling frequency is 120 KHz, and a sample value of the impulse response indicated in FIG. 11 is exhibited is shown in FIG. 12.

In the circuit illustrated in FIG. 12, there is provided a multistage delay circuit 50 comprising 28 unit delay elements D1 through D28 in cascade connection. This number "28" of these unit delay elements is derived by substracting from the number "33" corresponding to the number of sample values of impulse response indicated in FIG. 11 the number "4" of those sample values ($h1$, $h2$, $h32$, and $h33$) of the sample values of impulse response in which the values of the coefficient $h$ at the two end parts assume zero value and further substracting the number "1" which can be reduced by determining the manner in which $t = 0$ is taken, that is, $33 - 4 - 1 = 28$. These unit delay elements D1 through D28 have delay times of $8\frac{1}{3}$ μsec. which is the same as the sampling periods of $8\frac{1}{3}$ μsec. of the sampler 41.

In the instant signal processing circuit, there is provided a changeover switch 43 having fixed contact points 43a through 43k, of which the fixed contact point 43f in the middle is connected to receive an output of the unit delay element D14. Accordingly, the output signals of the unit delay elements D9 through D19 can be suitably selected and led out with the delay time of the output signal of the unit delay element D14 as a standard reference. In the instant embodiment, it is possible by operating the changeover switch 43 to derive signals of suitable delay times in steps of $8\frac{1}{3}$ μsec. with a range of $116\frac{2}{3}$ μsec. $\pm 41\frac{2}{3}$ μsec.

The sample values of impulse response indicated in FIG. 11 and distributed symmetrically left and right with the sample value $h17$ as a center. Here, by setting the sample value of $h17$ as a center. Here, by setting the sample value of $h17$ at 1 (unity) and determining the ratios thereto of the other sample values, the following result is obtained.

$h3 = h31 = 0.091$ $h7 = h27 = = 0.127$ $h11 = h23 = 0.21$ $h15 = h19 = - 0.65$ $h17 = 1$

The circuit is further provided with an adding circuit 52 for adding an input signal to the unit delay element D1 and the output signal of the unit delay element D28, an adding circuit 53 for adding the output signals of the unit delay elements D4 and D24, an adding circuit 54 for adding the output signals of the unit delay elements D8 and D20, and an adding circuit 55 for adding the output signals of the unit delay elements D12 and D16. The outputs of the adding circuits 52 through 55 are supplied, together with the output of the unit relay element D14, to a coefficient summing circuit 51.

In this connection, the inputs and outputs of the unit delay elements D1 through D28 and the sample values $h1$ through $h33$ of impulse response indicated in FIG. 11 have relationships of correspondence wherein there is correspondence respectively between the input of D1 and $h3$, the output of D4 and $h7$, the output of D8 and $h11$, the output of D12 and $h15$, the output of D14 and $h17$, the output of D16 and $h19$, the output of D20 and $h23$, the output of D24 and $h27$, and the output of D28 and $h31$.

The coefficient summing circuit 51 operates to add respectively the first power of the coefficient 0.091 with respects to the output of the adding circuit 52, of the coefficient $-0.127$ with respect to the output of the adding circuit 53, of the coefficient 0.21 with respect to the output of the adding circuit 54, of the coefficient $-0.65$ with respect to the output of the adding circuit 55, and of the coefficient 1 with respect to the output of the unit delay element D14 and produces respective outputs which are sent out through an output terminal 46.

As a consequence, only an angle-modulated difference signal is obtained from the coefficient summing circuit 51. The output signal of this coefficient summing circuit 51 is delayed by 116⅔ μsec. relative to the signal led out from the pickup cartridge 11. Therefore, the circuit is so adapted that, as described above, the delay times of the signals which can be led out from the changeover switch 43 are suitably selected in the range of from 116⅔ ± 41⅔ μsec.

The effect of terminating the impulse response with a finite time width will now be considered. When this terminated time width is denoted by $\tau w$, the new impulse response $h'(t)$ becomes as follows.

$$h'(t) = h(t) \cdot W(t) \quad (9)$$

where $W(t)$ is a time window function, and $$W(t) = 1 - \tau w \leq t \leq \tau w = 0, t < -\tau w, \tau w < t$$

By subjecting Eq.(9) to Fourier transformation to determine the transmission characteristic $H'(j\omega)$, the following expression is obtained.

$$H'(j\omega_0) = \int_{-\infty}^{\infty} H(j\omega) \frac{2\sin(\omega - \omega_0)\tau w}{(\omega_0 - \omega)} d\omega \quad (10)$$

When, with this Eq.(10) as a basis, the transmission characteristic due to the impulse response of the finite time width indicated in FIG. 11 is sought, the curve I shown in FIG. 13 is obtained. This transmission characteristic curve I, while having rounded curves in contrast to the ideal characteristic I indicated in FIG. 5, indicates a good characteristic. Furthermore, the delay time characteristic II within the transmission band is flat. In this connection, the cut-off characteristic of the transmission characteristic is improved by an increase in the number of terms of $h$, and the manner in which it is set is determined in accordance with the purpose of use of the band-pass filter.

In each of the above described first and second embodiments, the signal processing circuit (band-pass filter) comprises the sampler 41 and the multistage delay circuit 42 or 50. In actual practice, however, a constituent element possessing the functions of both the sampler 41 and the multistage delay circuit 42 (50) as, for example, an analog shift register of bucket brigade device (BBD) type, may be used.

Figure 14:
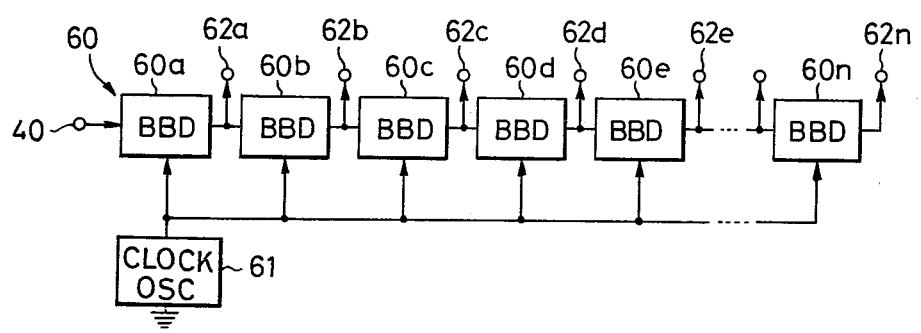
FIG. 14 is a circuit diagram of an embodiment of a multistage delay circuit in the circuit illustrated in FIG. 12.

On embodiment of an arrangement of an analog shift register of BBD type is indicated in FIG. 14. In this arrangement, the BBDs 60a through 60n of a BBD-type analog shift register 60 are so set by a clock oscillator 61 that the unit delay quantity will become 8⅓ μsec. The junction points between adjacent BBDs 60a through 60n are respectively connected to output terminals 62a through 62n, from which specific delay outputs are derived.

Figure 15:
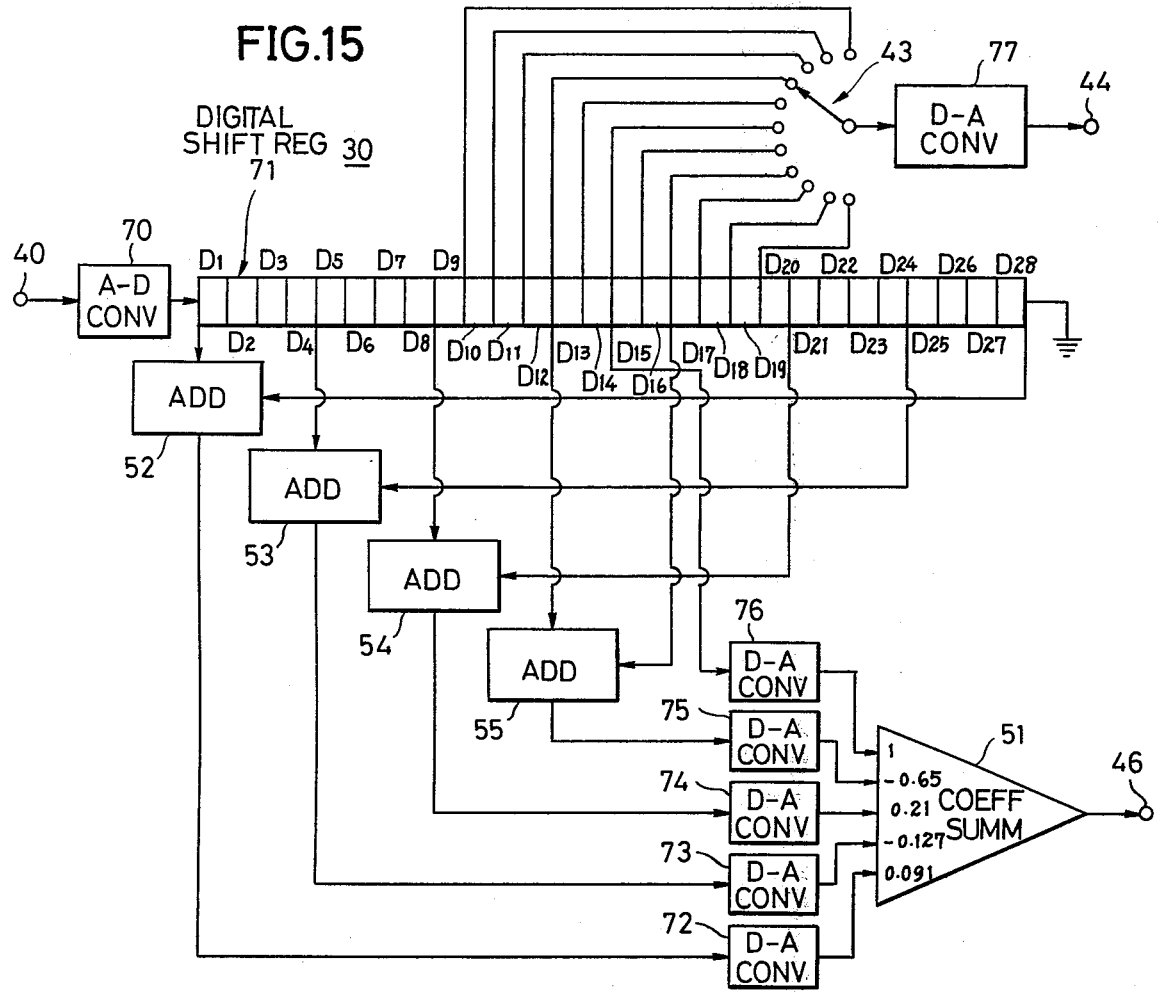
FIG. 15 is a circuit diagram showing a third embodiment of the signal processing circuit in the system illustrated in FIG. 3.

As a third embodiment of the signal processing circuit 30, a circuit in which a digital shift register is used for the multistage delay circuit 42 is illustrated in FIG. 15, in which parts which are the same as corresponding parts in FIG. 12 are designated by like reference numerals and characters.

A signal entering this circuit 30 through its input terminal 40 is supplied by way of an analog-digital (A — D) converter 70 provided in place of the sampler 41 to a digital shift register 71 comprising digital unit delay elements D1 through D28. The output signals of adding circuits 52, 53, 54, and 55, and the unit delay element D14 are respectively supplied by way of digital-analog (D — A) converters 72, 73, 74, 75, and 76 to the coefficient summing circuit 51. Furthermore, signals obtained through the changeover switch 43 are passed through a digital-analog (D — A) converter 77 and conducted to the terminal 44.

In the circuit of the instant embodiment, analog signals are converted into digital signals, and delays and the like of the signals are digitally processed. By selecting the clock pulse frequency of the digital shift register 71 at a specific value (120 KHz in the above described embodiment), an operation equivalent to that of the preceding embodiment can be carried out.

When, as described above, the analog shift register 60 of BBD type, the digital shift register 71, or the like is used for the multistage delay circuit 42, it is possible to constitute the principal parts of the signal processing circuit 30 in the form of integrated circuits.

Next, a band-pass filter of even more ideal character having a group delay time characteristic which is flat within the transmission band and, moreover, having an amplitude characteristic which is symmetrical with respect to the center of the transmission band will be described. This band-pass filter to be described next is capable of effectively separating an angle-modulated wave signal from another signal in the vicinity thereof and transmitting the same without distortion, the angle-modulated wave signal being one wherein the modulation index of a signal of a frequency band in which distortion becomes a problem is not too large as in the case of an angle-modulated wave signal reproduced from the above mentioned discrete 4-channel record disc.

Figure 16:
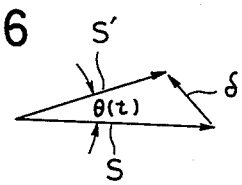
FIG. 16 is a vector diagram for a description of signal distortion occurring in a transmission system.

FIG. 16 shows a vector frequency-modulated (hereinafter abbreviated to FM) signal $S$ when it passes through the transmission path of the transmission characteristic $H$ and is newly subjected to an addition of an error component $\delta$ due to the effect of the transmission characteristic $H$, thereby being changed to an FM signal $S'$. In this vector diagram, a phase error $\theta(t)$ which has been newly produced becomes a signal distortion component as a result of phase detection. This phase error $\theta(t)$ is expressed as follows:

$$\theta(t) = l\,\text{mag}\left[\log\left(\frac{S'}{S}\right)\right] = l\,\text{mag}\left[\log\left(1+\left(\frac{\delta}{S}\right)\right)\right]$$
$$= l\,\text{mag}\left[\frac{\delta}{S} - \frac{1}{2}\left(\frac{\delta}{S}\right)^2 + \frac{1}{3}\left(\frac{\delta}{S}\right)^3 + \ldots\right] \quad (11)$$

Here, L mag indicates the specification of the imaginary part of a complex number.

In the case where the modulation index of the FM signal S is small, there is the following relationship.

$$\left|\frac{\delta}{S}\right| \ll 1 \quad (12)$$

Accordingly, the above Eq.(11) becomes $$\theta(t) = l\,\text{mag}\left[\frac{\delta}{S}\right] \quad (13)$$

Furthermore, the transmission characteristic $H$ can be expressed as a function of the relative angular frequency X as viewed from the carrier wave angular frequency $\omega_0$ of the FM signal (where $X = \omega - \omega_0$) as follows.

$$H(X) = 1 + E(X) \quad (14)$$

When the group delay characteristic of the transmission characteristic $H(X)$ is zero, and, moreover, if the amplitude characteristic thereof is symmetrical with respect to $X = 0$, it may be said that the transmission characteristic is a real function and an even function. Accordingly, in the above Eq.(14), the term $E(X)$ representing the component which causes an error $\delta$ to be produced in the signal is also a real function and an even function. $E(O)$ will be taken to be equal to zero.

At this time, the FM signal S is expressed as $$S = e^{jm\sin pt} = \sum_{-\infty}^{\infty} Jn(m)\,e^{jnpt} \quad (15)$$

but hereinafter $Jn(m)$ will be abbreviated to $Jn$. Here, $m$ is a modulation index, while $n$ denotes the degree of a Bessel function.

The distortion $\delta$ is expressed as follows.

$$\delta = \sum_{-\infty}^{\infty} E(np)Jn\,e^{jnpt} \quad (16)$$

Therefore, $\theta(t)$ is expressed as follows.

$$\theta(t) = l\,\text{mag}\left[\sum_{l=-\infty}^{\infty}\sum_{n=-\infty}^{\infty} E(np)\,Jn\cdot J_l\,e^{j(n-l)pt}\right] \quad (17)$$

In this Eq.(17), $l$ is a symbol used in place of the degree $n$ of the Bessel function in Eq.(15). When $(n-l) = S$ and the above Eq.(17) is modified, the following expression is obtained.

$$\theta(t) = l\,\text{mag}\left[\sum_{S=-\infty}^{\infty}\left(\sum_{n=-\infty}^{\infty} E(np)\,Jn\cdot Jn-s\right)e^{jSpt}\right] \quad (18)$$

Since $E(np)$ is a real number, the coefficients of $e^{jSpt}$ all become real numbers. Accordingly, the following expression is obtained.

$$\theta(t) = \sum_{S=0}^{\infty}\left[\sum_{n=-\infty}^{\infty} E(np)\{Jn\cdot Jn-s - Jn\cdot Jn+s\}\right]\cdot \sin Spt \quad (19)$$

It is apparent from this equation that $\theta(t)$ is made up of sin pt and the higher harmonic components thereof.

When the coefficient of the above mentioned higher harmonic components is denoted by $\alpha s$, the following equations are obtained.

$$\alpha 1 = -2 J_0 J_1 E(0) + 2\sum_{k=1}^{\infty} J_k(J_{k-1} - J_{k+1})E(kp) \quad (20)$$

$$\alpha 2 = 0 \quad (21)$$

$$\alpha 3 = -2 J_0 J_3 E(0) + 2\sum_{k=1}^{\infty} J_k(J_{k-3} - J_{k+3})E(kp) \quad (22)$$

$$\alpha 4 = 0 \quad (23)$$

$\alpha 1$ is the fundamental harmonic component and is unrelated to distortion, while $\alpha 2$ and $\alpha 4$ are both zero and have no relationship with distortion. Accordingly, by causing $\alpha 3$ expressed by Eq.(22) to become zero, a distortionless state can be attained.

Then, in order to express this distortionless condition by an easily understandable equation, the following approximations of Bessel functions are applied to Eq.(22).

$$Jn(m) \doteq \frac{1}{n!}\left(\frac{m}{2}\right)^n \quad (24)$$

$$J-n(m) = (-1)^n Jn \quad (25)$$

As a result, the following equation is obtained.

$$\alpha 3 \doteq 2\left[\frac{1}{16}m^3 E(p) - \frac{1}{16}m^3 E(2p) + \frac{1}{48}m^3 E(3p)\right] \quad (26)$$

where values above $J4(m)$ are very small and are therefore omitted. The distortionless condition $\alpha 3 = 0$ becomes as follows by equating Eq.(26) to zero.

$$3E(p) - 3E(2p) + E(3p) = 0 \quad (27)$$

The aforementioned $E(X)$ may be expressed as a power series as follows.

$$E(X) = a1 X^2 + a2 X^4 + a3 X^6 + \ldots$$
$$= \sum_{n=1}^{\infty} an X^{2n} \quad (28)$$

Therefore, it becomes necessary that the above Eq.(27), in the form of Eq.(28), satisfy the condition of the following equation.

$$3E(X) - 3E(2X) + E(3X) = \sum_{n=1}^{\infty} \left\{ 3 - 3X(2)^{2n} + (3)^{2n} \right\} a_n X^{2n}$$

$$= 0 \qquad (29)$$

For this Eq.(29) to become zero irrespective $X$, it becomes necessary that the condition of the following equation be satisfied.

$$a_2 = a_3 = a_4 = \ldots = 0 \qquad (30)$$

Consequently, $E(X)$ becomes as follows.

$$E(X) = a_1 X^2 \qquad (31)$$

When this Eq.(31) is substituted in Eq.(14), the transmission characteristic of Eq.(14) satisfying the distortionless condition is expressably by the following equation.

$$H(X) = 1 + a_1 X^2 \qquad (32)$$

When the transmission characteristic $H(X)$ expressed by Eq.(32) is multiplied by a constant time delay operator, the following equation is obtained.

$$H'(X) = [1 + a_1 X^2] e^{-j\omega t} \qquad (33)$$

Since this indicates merely that a time delay is produced in the detector output, the transmission characteristic $H'(X)$ expressed by this Eq.(33) also satisfies the distortionless condition.

Therefore, the transmission characteristic $H(j\omega)$ of a band-pass filter capable of satisfying the distortionless condition is derived as follows by substituting $(\omega - \omega_0)$ for X in the above Eq.(33) and using the relation $a_1 = -a$.

$$H(j\omega) = [1 - a(\omega - \omega_0)^2] e^{-j\omega \tau_d} \qquad (34)$$

Here, $a$ is a constant which can be selected at will in accordance with the conditions of the band width and cut-off quantity; $\omega_c$ is the angular frequency of the carrier wave of the FM signal which is made the object of transmission and is the center angular frequency of the band-pass filter; and $\tau d$ denotes the delay time of the band-pass filter. The group delay characteristic of a band-pass filter of the transmission characteristic indicated by Eq.(34) is completely flat, and, moreover, the amplitude characteristic thereof is fully symmetrical with respect to the center frequency $\omega_c$.

Then, when a band-pass filter of the transmission characteristic representable by the above Eq.(34) is constituted by a noncyclic sampling filter as shown in FIG. 12, and the impulse response $h(t)$ thereof is determined, the following is obtained by an inverse Fourier transformation.

$$h(t) = \int_{-\infty}^{\infty} H(j\omega) e^{j\omega t} d\omega \qquad (35)$$

By substituting Eq.(34) for the term $H(j\omega)$ in this Eq.(35), the following equation is obtained.

$$h(t) = \frac{4a}{t^2} \left\{ \frac{1}{t} \sin \frac{t}{\sqrt{a}} - \frac{1}{\sqrt{a}} \cos \frac{t}{\sqrt{a}} \right\} \cos \omega_0 t \qquad (36)$$

In the case where the impulse response $h(t)$ is sampled by the repetitive period $\tau s$, the following equation is obtained.

$$h'(t) = h(t) \times \sum_{n=-\infty}^{\infty} \delta(t - n\tau s) \qquad (37)$$

where $\delta(t)$ is a delta function.

The transmission characteristic $H'(j\omega)$ corresponding to the impulse response of the above Eq.(37) can be derived in the following form.

$$H'(j\omega) = \int_{-\infty}^{\infty} h'(t) e^{-j\omega t} dt$$

$$= \sum_{r=-\infty}^{\infty} \int_{-\infty}^{\infty} H(j\omega) \delta(\omega - r\omega s) d\omega, \qquad (38)$$

where $$\omega s = \frac{2\pi}{\tau s}$$

Figure 17:
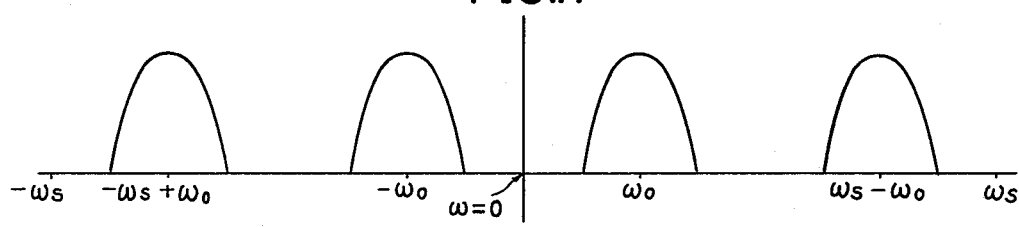
FIG. 17 is a graph indicating a transmission characteristic of a multiplexed band-pass filter.

This Eq.(38) indicates a multiplexed band-pass filter having $\omega s$ as a period as indicated, for example, in FIG. 17.

As indicated in Eq.(38), when the integration range is from $-\infty$ to $+\infty$, no interference whatsoever occurs mutually between the pass bands, but when the time width is finite, side lobes are produced and give rise to effects on the characteristics mutually between the pass bands.

However, if all of the pass bands are disposed at equal intervals, the symmetry of the amplitude characteristic with respect to the center angular frequency will be preserved even if side lobes should be produced. The condition for this symmetry of the amplitude characteristic with respect to the center angular frequency is defined by the following Eq.(39) as is apparent from FIG. 17.

$$\omega s = 4\omega_0 \qquad (39)$$

This Eq.(39) indicates that it is necessary that the sampling angular frequency $\omega s$ of the sampler 41 in the sampling filter be 4 times the center angular frequency $\omega_0$ of the band-pass filter.

Next, when the weighted coefficient $\alpha$ in the coefficient addition circuit is determined with the assumption that the impulse response $h(t)$ of the above Eq.(36) is sampled with a sampling period matching the condition of Eq.(39), the following equations are obtained.

$$\alpha_0 = \frac{4}{3\sqrt{a}} \qquad (40)$$

$$\alpha_n = \frac{16\,\omega_0{}^2\,a}{n^2\pi^2}\left\{\frac{2\omega_0}{n\pi}\sin\frac{n\pi}{2\omega_0\sqrt{a}} - \frac{1}{\sqrt{a}}\cos\frac{1}{2\omega_0\sqrt{a}}\right\}\cdot\cos\frac{n\pi}{2} \qquad (41)$$

where $n = 1, 2, 3, \ldots\ldots$

It is apparent from Eq.(41) that $\alpha n$ becomes zero when $n$ is an odd number. Therefore, the band-pass filter of the sampling filter becomes simple as indicated in FIG. 18.

Figure 18:
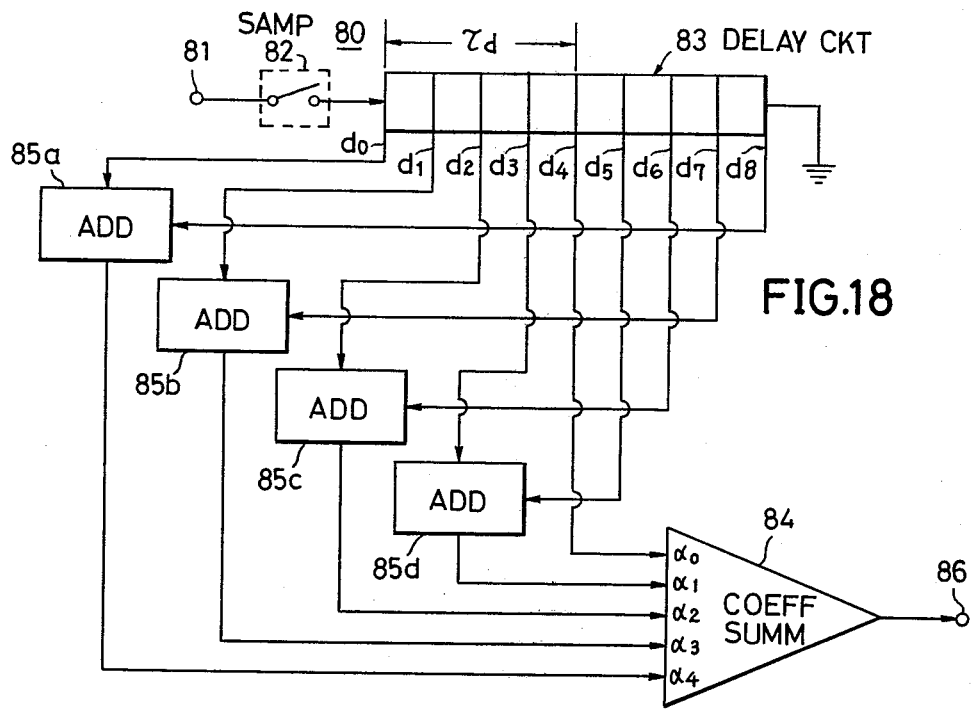
FIGS. 18 and 19 are circuit diagrams respectively showing first and second embodiments of the band-pass filter of the invention in the case where it is constituted as a band-pass filter unit structure.

The organization of the band-pass filter 80 shown in FIG. 18 is designed by putting $2n = k$ in the above Eq.(41) to obtain the following equations.

$$\alpha_0 = \frac{4}{3\sqrt{a}} \qquad (42)$$

$$\alpha_k = \frac{4\,\omega_0\,a}{k^2\pi^2}\left\{\frac{\omega_0}{k\pi}\sin\frac{k\pi}{\omega_0\sqrt{a}} - \frac{1}{\sqrt{a}}\cos\frac{k\pi}{\omega_0\sqrt{a}}\right\}\cos k\pi \qquad (43)$$

where $k = 0, 1, 2, 3, \ldots\ldots$
In the example illustrated in FIG. 18, $k = 0$.

In this band-pass filter shown in FIg. 18, a signal including the FM signal to be transmitted is applied to an input terminal 81, and a sampling pulse having a repetitive angular frequency $\omega s$ which is 4 times the center angular frequency of the band-pass filter is applied to a sampler 82. A delay circuit 83 comprising a plurality of unit delay elements having a delay time $\tau = \pi/\omega c$ each and connected in cascade arrangement uses analog shift registers (e.g., analog shift registers of BBD type) in the case where the output of the sampler 82 is a pulse amplitude modulated (PAM) signal and uses digital shift registers in the case where the output signal of the sampler 82 is a pulse code modulated (PCM) signal, as is apparent from the preceding embodiments. In FIG. 18, the delay time of the band-pass filter is denoted by $\tau d$.

The signals of terminals $do$ and $d8$ are applied to an adder 85a; the signals of terminals $d1$ and $d7$ are applied to an adder 85b; the signals of terminals $d2$ and $d6$ are applied to an adder 85c; and the signals of terminals $d3$ and $d5$ are applied to an adder 85d. The outputs of the adders 85a through 85d and the output at the terminal $d4$ are supplied to a coefficient summing circuit 84, where they are respectively multiplied by weighted coefficients $\alpha 4$ through $\alpha 0$ and summed. As a result, an FM signal which has been band-pass filtered is obtained at the output terminal 86 of the coefficient summing circuit 84.

Figure 19:
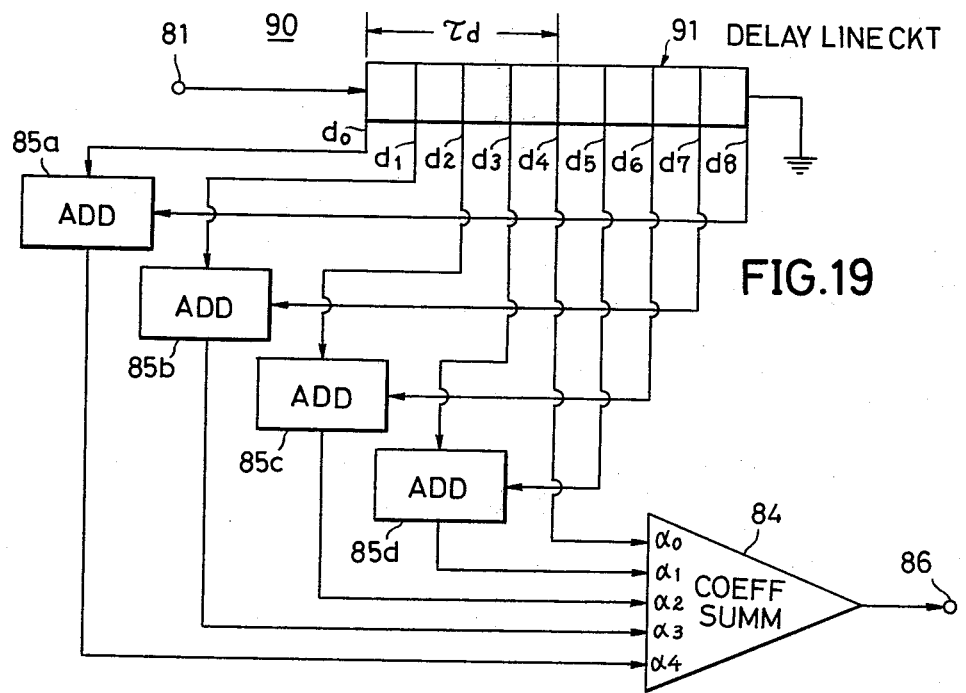

Next, a band-pass filter of delay line filter form will be described with reference to FIG. 19, in which parts which are the same as corresponding parts in FIG. 18 are designated by the same reference numerals. This band-pass filter 90 has an input terminal 81 to which a signal is applied and thence supplied to an analog delay line 91. If the center of the delay line is taken at the time origin, $t = 0$, the transmission characteristic of this filter will be as follows.

$$H(j\omega) = \alpha_0 + \alpha_1(e^{j\omega\tau} + e^{-j\omega\tau}) + \alpha_2(e^{j\omega 2\tau} + e^{-j\omega 2\tau}) + \alpha_3(e^{j\omega 3\tau} + e^{-j\omega 3\tau}) \qquad (44)$$

where $\tau$ is the delay time in a unit delay element division of the delay line 91.

By rearranging this Eq.(44), the following equation is obtained.

$$H(j\omega) = \alpha_0 + 2\sum_{i=1}^{n}\alpha_i\cos i\omega\tau$$

$$= 2\left\{\frac{\alpha_0}{2} + \sum_{i=1}^{n}\alpha_i\cos i\omega\tau\right\} \qquad (45)$$

As is apparent from Eq.(45), the group delay time characteristic is constant over the entire band since the transmission characteristic $H(j\omega)$ is a real function. However, if the absolute magnitude of delay at the time origin, $t = 0$, is denoted by $\tau d$, it can be said that the group delay time characteristic is $\tau d$ over the entire band.

Furthermore, the above mentioned transmission characteristic $H(j\omega)$ is a function with $\omega p = 2\pi/\tau$ as a fundamental period, and the filter becomes a multi-plexed band-pass filter of a characteristic as indicated in FIG. 17.

The weighted coefficient $\alpha$ is determined by subjecting this transmission characteristic $H(j\omega)$ to a Fourier series expansion, as follows.

$$\alpha_k = \frac{1}{\omega p}\int_0^{\omega p} H(j\omega)\cos k\frac{2\pi}{\omega p}\omega\,d\omega \qquad (46)$$

where, $k = 0, 1, 2, 3, \ldots\ldots$

Figure 20:
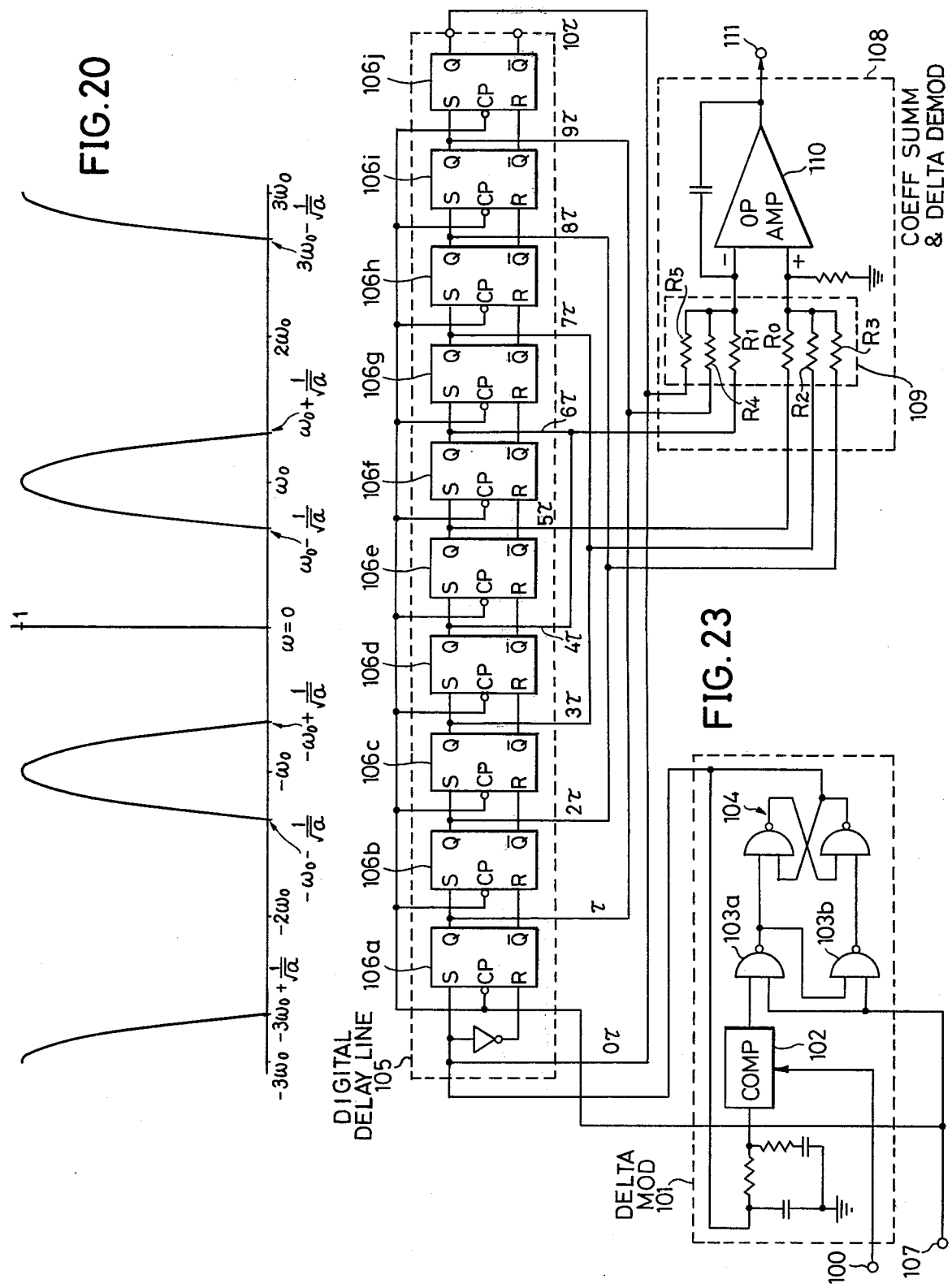
FIG. 20 is a graph indicating the transmission characteristic of a multiplexed band-pass filter.

It will now be assumed that, for the transmission characteristic of the band-pass filter being designed, the characteristic indicated in FIG. 20 and having a pass band fulfilling the condition of the above Eq.(34) is selected.

In this case, the center angular frequency in the desired pass band of the band-pass filter is represented by $$\omega_0 = \frac{\omega p}{2} \qquad (47)$$

Then, by substituting the transmission characteristic $H(j\omega)$ of Eq.(34) and the center angular frequency $\omega_0$ of Eq.(47) into Eq.(46) and rearranging it with the use of the relationship $X = \omega - \omega_0$, Eq.(46) becomes $$\alpha_k = \frac{1}{2\omega_0}\int_{-\frac{1}{\sqrt{a}}}^{\frac{1}{\sqrt{a}}}(1 - aX^2)\cos\left\{\frac{k\pi}{\omega_0}(X + \omega_0)\right\}dX \qquad (48)$$

Eq.(43) is obtained as a result of calculation with this Eq.(48).

Furthermore, with respect to $k = 0$, the following equation is obtained from $\lim_{k \to 0} \alpha R$.

$$\alpha_0 = \frac{4}{3\sqrt{a}} \qquad (49)$$

The weighted coefficient expressed by Eqs.(43) and (49) in the band-pass filter of delay line filter form derived in the above described manner is exactly the same as that of Eqs.(43) and (42) in the band-pass filter of the aforedescribed sampling filter form. Therefore, the band-pass filter 90 of delay line filter form shown in FIG. 19 is of the same circuit organization as the band-pass filter 80 of the non-cyclic type sampling filter form shown in FIG. 18 except that the band-pass filter 90 does not have a sampler 82 and that its delay circuit 91 is an analog delay line.

Figure 21:
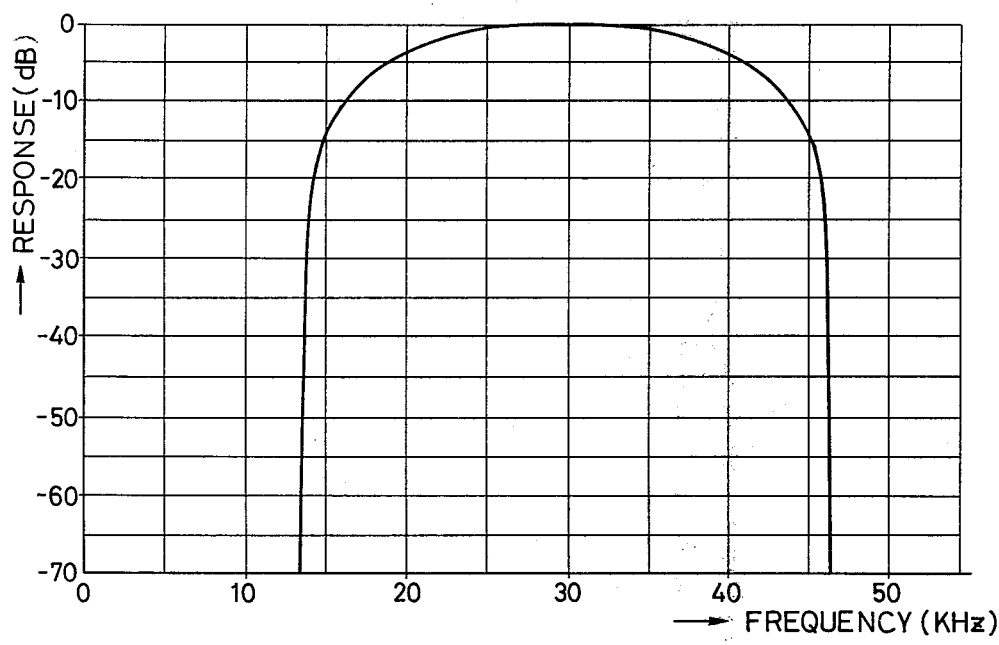
FIG. 21 is a graph indicating an objective frequency-response characteristic of the band-pass filter of the invention in the case where a delay line circuit is used in a delay circuit.
Figure 22:
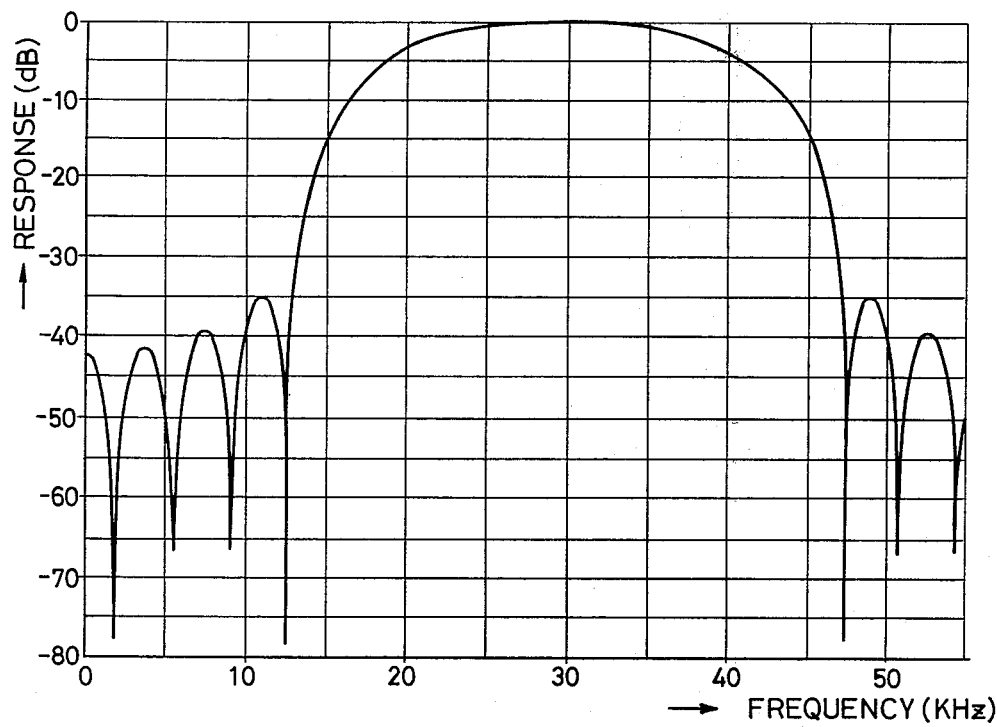
FIG. 22 is a graph indicating the frequency response characteristic of a band-pass filter which has been actually organized with respect to the objective characteristic indicated in FIG. 21.

The objective frequency-response characteristic of a band-pass filter wherein $a$ is so set that, with a center frequency of 30 KHz, the attenuation at frequencies separated by ± 15 KHz from this center will be 15 dB is indicated in FIG. 21. The frequency-response characteristic curve of a band-pass filter in which the objective characteristic indicated in FIG. 21 is actually realized in a specific form under the condition of $k = 7$ is shown in FIG. 22.

An embodiment of an actual circuit of the band-pass filter of the present invention reduced to practice is illustrated in FIG. 23. An input signal including a frequency-modulated signal and applied to an input terminal 100 of this circuit is supplied to a delta modulator 101 in IC form comprising a comparator 102, NAND circuits 103a and 103b, and a flip-flop 104 and is converted into a pulse train. This pulse train signal is supplied to a digital delay line 105 comprising digital shift registers (IC) 106a through 106j connected in cascade arrangement. On one hand, a clock signal is supplied through a terminal 107 to the NAND circuits 103a and 103b of the delta modulator 101 and to the digital shift registers 106a through 106j of the digital delay line 105. In the period in which the above mentioned pulse train signal reaches the output $Q$ from the input $S$ of one digital shift register, a constant delay time $\tau$ determined by the clock signal from the terminal 107 and by the construction of the digital shift register is imparted to this pulse train signal.

In the instant embodiment, since the digital delay line 105 comprises ten digital shift registers 106a through 106j, pulse trains having delays of $0\tau$ through $10\tau$ are obtained from the input side of the digital shift register 106a and the output sides of the digital shift registers 106a through 106j. Here, as described above, these pulse trains are multiplied by coefficients determined by Eqs.(42) and (43) and summed and are then delta demodulated. Since the demodulation of a pulse train thus delta modulated can be accomplished merely by passing it through an integration circuit, an operational amplifier (IC) can be used and caused to possess the two functions of addition and integration at the same time. This is a very convenient feature.

The pulse trains having the above mentioned delays $0\tau$ through $10\tau$ are applied to coefficient addition resistors 109 within a block circuit 108 for carrying out addition and integration operations, are added with the coefficients of the above mentioned equations, and are summed and integrated by an operational amplifier 110. As a result, a frequency-modulated signal which has been band-pass filtered is obtained from an output terminal 111.

Further, this invention is not limited to these embodiments but various variations and modifications may be made without departing from the scope and spirit of the invention.

What is claimed is:

1. A band-pass filter for frequency-modulated signal transmission comprising a delay circuit comprising a plurality of unit delay elements connected in cascade arrangement and receiving as input a signal containing a frequency-modulated signal, and a coefficient summing circuit for carrying out coefficient summing of outputs produced by specific delay elements of said delay circuit and producing as output said frequency modulated signal in band-pass filtered state, said band-pass filter having a transmission characteristic represented substantially by the equation $$H(j\omega) = [1 - a(\omega - \omega_0)^2]\, e^{-j\omega \tau_d},$$

where:
  $a$ is a constant for imparting the attenuation characteristic of the filter;
  $\omega_0$ is the angular frequency of the carrier wave of the frequency-modulated signal and the center angular frequency of the band-pass filter; and
  $\tau_d$ is the delay time of the band-pass filter.

2. A band-pass filter as claimed in claim 1 in which said delay circuit comprises unit delay elements having delay times of $\pi/\omega_0$ in cascade-connected arrangement, and said coefficient addition circuit carries out coefficient addition with a weighted coefficient $\alpha_k$ represented by $$\alpha_k = \frac{4\omega_0^2 a}{k^2\pi^2} \left\{ \frac{\omega_0}{k\pi} \sin\frac{k\pi}{\omega_0\sqrt{a}} - \frac{1}{\sqrt{a}} \cos\frac{k\pi}{\omega_0\sqrt{a}} \right\} \cos k\pi$$

3. A band-pass filter as claimed in claim 2 which further comprises a sampler for sampling the input signal with a repetitive angular frequency $4\omega_0$ as a sampling angular frequency and supplying the signal thus sampled to said delay circuit.

4. A band-pass filter as claimed in claim 1 in which said delay circuit comprises an analog delay line circuit.

5. A band-pass filter as claimed in claim 1 in which said delay circuit comprises an analog shift register circuit in which bucket brigade devices are used.

6. A band-pass filter as claimed in claim 1 in which there are further provided an analog-digital converter means for receiving an input signal and supplying an output signal thereof to said delay circuit and a digital-analog converter means for receiving as input the outputs of specific unit delay elements of said delay circuit and supplying output signals thereof to said coefficient summing circuit, and said delay circuit comprises a digital shift register circuit.

7. A band-pass filter as claimed in claim 1 in which; there is further provided a delta modulator for delta modulating an input signal and supplying an output pulse train signal thereof to said delay circuit; said delay circuit comprises a plurality of digital shift registers in cascade-connected arrangement; and said coefficient summing circuit comprises resistors for coefficient addition of outputs of said delay circuit and an operational amplifier for summing and integrating signals which have thus passed through said resistors and delta demodulating the resulting signals thus summed and integrated.

8. A band-pass filter as claimed in claim 1 which further comprises means for selectively obtaining delayed signals from any of the unit delay elements of said delay circuit.

9. A band-pass filter as claimed in claim 8 which is provided in a multichannel record disc reproducing system having means for reproducing a multiplexed signal of a direct wave signal and an angle-modulated wave signal containing a frequency-modulated signal from a multichannel record disc, separating means for separating the direct wave signal from the resulting reproduced signal, and demodulating means for demodulating said angle-modulated wave signal, said band-pass filter filters the angle-modulated wave signal from said reproduced signal and supplies the same to said demodulating means, and said means for selectively obtaining delayed signals operates to supply the delayed reproduced signals to said separating means.

* * * * *